United States Patent
Numakura

(10) Patent No.: US 7,738,987 B2
(45) Date of Patent: Jun. 15, 2010

(54) DEVICE AND METHOD FOR CONTROLLING SUBSTRATE PROCESSING APPARATUS

(75) Inventor: Masahiro Numakura, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 246 days.

(21) Appl. No.: 11/945,539

(22) Filed: Nov. 27, 2007

(65) Prior Publication Data
US 2008/0125899 A1    May 29, 2008

Related U.S. Application Data

(60) Provisional application No. 60/891,905, filed on Feb. 27, 2007.

(30) Foreign Application Priority Data
Nov. 28, 2006    (JP) ............................. 2006-319832

(51) Int. Cl.
G06F 19/00 (2006.01)
G06F 7/00 (2006.01)
C23F 1/00 (2006.01)
H01L 21/306 (2006.01)
C23C 14/00 (2006.01)
C25B 11/00 (2006.01)
C25B 13/00 (2006.01)

(52) U.S. Cl. ...................... 700/114; 700/100; 700/104; 700/112; 700/218; 700/228; 156/345.32; 204/298.25

(58) Field of Classification Search ......... 700/112–114, 700/121, 218, 228; 204/298.25; 156/345.31, 156/345.32
See application file for complete search history.

(56) References Cited

U.S. PATENT DOCUMENTS

| 4,715,921 | A | | 12/1987 | Maher et al. |
| 5,855,681 | A | * | 1/1999 | Maydan et al. ............. 118/719 |
| 5,898,588 | A | * | 4/1999 | Morimoto ................... 700/108 |
| 6,122,566 | A | * | 9/2000 | Nguyen et al. .............. 700/218 |
| 6,190,424 | B1 | * | 2/2001 | Koike ........................ 29/25.01 |
| 6,217,663 | B1 | * | 4/2001 | Inokuchi et al. ............. 118/728 |
| 6,340,405 | B2 | * | 1/2002 | Park ...................... 156/345.32 |
| 6,363,294 | B1 | * | 3/2002 | Coronel et al. .............. 700/121 |

(Continued)

FOREIGN PATENT DOCUMENTS

JP    63-133532    6/1998

(Continued)

*Primary Examiner*—Crystal J Barnes-Bullock
(74) *Attorney, Agent, or Firm*—Oblon, Spivak, McClelland, Maier & Neustadt, L.L.P.

(57) ABSTRACT

Depending on the degree of microfabrication requested for each wafer lot, transfer of wafers is controlled. A substrate processing apparatus includes a plurality of PMs 400 and an LLM 500 and is controlled by an EC 200. The EC 200 includes a selection unit 255 and a transfer control unit 260. The unit 255 selects the PM to which the next wafer is to be transferred, and selects, for each lot, whether the wafers are transferred to the same PM in one-lot units or in one-substrate units depending on the degree of the microfabrication requested for each lot. When the wafer transfer in lot units is selected, the unit 260 sequentially transfers the wafers included in the lot to the selected PM. Otherwise the unit 260 sequentially OR transfers the wafers included in the lot from the selected PM to a different PM one by one.

20 Claims, 15 Drawing Sheets

U.S. PATENT DOCUMENTS

| | | | |
|---|---|---|---|
| 6,530,993 B2 * | 3/2003 | Hwang et al. | 118/719 |
| 6,767,439 B2 * | 7/2004 | Park | 204/298.25 |
| 6,802,934 B2 * | 10/2004 | Saeki et al. | 156/345.31 |
| 6,954,716 B2 * | 10/2005 | Tanaka et al. | 702/184 |
| 7,062,344 B2 * | 6/2006 | Yokoyama et al. | 700/112 |
| 7,159,599 B2 * | 1/2007 | Verhaverbeke et al. | 134/109 |
| 7,521,089 B2 * | 4/2009 | Hillman et al. | 427/255.5 |
| 7,630,785 B2 * | 12/2009 | Ikeda | 700/100 |
| 2002/0011203 A1 * | 1/2002 | Kim | 118/305 |
| 2004/0107014 A1 * | 6/2004 | Park | 700/90 |
| 2006/0156979 A1 * | 7/2006 | Thakur et al. | 118/715 |
| 2007/0295274 A1 * | 12/2007 | Webb et al. | 118/719 |
| 2009/0291558 A1 * | 11/2009 | Kim et al. | 438/689 |
| 2009/0320749 A1 * | 12/2009 | Yoon et al. | 118/58 |

FOREIGN PATENT DOCUMENTS

| | | |
|---|---|---|
| JP | 11-67869 | 3/1999 |
| JP | 2005252105 A * | 9/2005 |

* cited by examiner

DEVICE AND METHOD FOR CONTROLLING SUBSTRATE PROCESSING APPARATUS

CROSS REFERENCE TO RELATED APPLICATIONS

The present invention contains subject matter related to Japanese Patent Application No. 2006-319832, filed on Nov. 28, 2006 and Provisional Application No. 60/891,905, filed on Feb. 27, 2007, the entire contents of which being incorporated herein by reference.

BACKGROUND OF THE INVENTION

1. Field of the Invention

The present invention relates to a device and a method for controlling a substrate processing apparatus that performs a specified process on a substrate, and to a storage medium that stores the control program. More particularly, the present invention relates to a method for controlling the transfer of the substrate.

2. Description of the Related Art

The recent substrate processing apparatuses installed in the semiconductor factory mostly include a transfer mechanism transferring a substrate and two or more processing chambers performing a specified process on the substrate. In the substrate processing apparatus including a plurality of processing chambers, it is important to transfer a large number of substrates to the processing chambers in a way to increase the throughput of the substrate process and increase the productivity of the products.

Some of the conventional substrate processing apparatuses operate as follows. Different substrates are processed in different processing chambers at the same time. The processing is done after sequentially transferring the different substrates to the different processing chambers through different transfer paths for the different substrates (hereinafter this transfer method is also referred to as "OR transfer"). Alternatively, the transfer paths for the different substrates are controlled so that the substrates are sequentially processed via two or more processing chambers (see, for example, Japanese Patent Laid-Open Application No. 63-133532). The substrates may thus be processed efficiently.

Others of the conventional substrate processing apparatuses refer to a signal indicating which processing chamber is operatable, and transfer the substrate only to a group of the operatable processing chambers (see, for example, Japanese Patent Laid-Open Application No. 11-067869). If any of the processing chambers cannot operate due to a failure or the like, other processing chambers may be used to process the substrate efficiently.

SUMMARY OF THE INVENTION

When different substrates are sequentially transferred to different processing chambers in normal operation and the substrates are subject to the same process in the processing chambers at the same time, respectively, the throughput of the substrate process is increased, but the substrates may have different processing (fabrication) states. This is because of original individual differences of the processing chambers and different atmosphere in the processing chambers due to different frequencies of use.

Lots are units in which the same products are manufactured. The fabrication states of the substrates in the same lot should thus be uniform and not be varied. Recent products have increasingly been requested to undergo fine microfabrication. To satisfy the request for the microfabrication, the substrates in the same lot should be processed accurately and uniformly, thereby providing products having uniform and high quality. The variation in the processing state that has previously been accepted may thus not be accepted any more to satisfy the required characteristics of the products.

For the lots to be microfabricated, therefore, the substrates may be transferred not by the method specified in a system recipe, but instead, by a different method to provide no variation in the fabrication state. The host computer may then be requested to perform such a transfer method change and use other appropriate methods. The host computer controls the semiconductor factory by managing the entire system. Requesting the host computer for the above operations is very complicated and impractical. In addition, the functions of the host computer system need to be changed drastically. Before the system operates stably, therefore, the entire substrate-processing system may disadvantageously be in an unstable state, even temporarily.

In view thereof, it is an object of the present invention to provide a device and a method for controlling a substrate processing apparatus, the device and method controlling the change of the transfer method depending on the degree of the microfabrication requested for each lot, and a storage medium that stores the control program.

To solve the issue, therefore, an embodiment of the present invention provides a control device for controlling a substrate processing apparatus, the apparatus including a plurality of processing chambers that perform a specified process on a substrate and a transfer mechanism that transfers the substrate, the control device comprising: a selection unit that selects a processing chamber to which a next substrate is to be transferred, and selects, for each substrate lot, whether the substrates are transferred to the same processing chamber in one-lot units or in one-substrate units depending on a degree of microfabrication requested for each lot; and a transfer control unit that sequentially transfers the substrates in the units selected by the selection unit to the processing chamber selected by the selection unit.

Depending on the degree of the microfabrication requested for each lot, therefore, it is selected for each lot whether the substrates are transferred to the same processing chamber in one-lot units or in one-substrate units. When one-lot units are selected, all substrates included in the relevant lot are transferred to the same processing chamber. This may avoid the issues where when different substrates are transferred to different processing chambers, the substrates have different fabrication states due to the individual differences and different atmosphere in the processing chambers. In other words, all substrates in a lot may be processed in the same process, thus processing all substrates in the lot in the same environment. This may provide, in one-lot units, almost the same products having no variation in the characteristics.

Recent products have increasingly been requested to undergo fine microfabrication. To satisfy the request for the microfabrication, a plurality of substrates in the same lot should undergo uniform and high-quality processes. The variation in the manufacturing state that has previously been accepted may thus not be accepted any more.

According to an embodiment of the present invention, the transfer method of the substrates included in the lot to be microfabricated is changed to the above transfer method that is controlled by the control device to provide the manufacturing state having no variation. In this way, without requesting the host computer to change the transfer units, the control device itself may change the transfer units. This may thus provide quick respond to the user request without drastically changing the functions of the host computer system currently in operation.

Note that whether the microfabrication process is requested or not may be determined by various methods as follows. It may be determined by, for example, the recipe type specified by the operator or the recipe content. The microfabrication request may also be determined as follows. The operator specifies in advance a units parameter as valid or invalid. When the units parameter is valid, it is determined that the microfabrication process is requested. When the units parameter is invalid, it is determined that the microfabrication process is not requested.

When the selection unit selects the one-substrate units, the transfer control unit may transfer a test substrate only to each processing chamber of the processing chamber group specified in the recipe before transferring the product substrates. The number of test substrates transferred to each processing chamber may be, for example, one or two or more.

Specifically, in the OR transfer in one-substrate units, the processing chambers should be checked in advance for being ready for processing the product substrates. The check is done by transferring, before the product substrates, the test substrate to all processing chambers to which the product substrates are to be OR transferred. The OR transfer thus minimally requires the number of test substrates corresponding to all processing chambers to which the product substrates are to be OR transferred.

When, however, the selection unit selects one-lot units, the transfer control unit may transfer the test substrate only to the selected processing chamber before transferring the product substrates. The number of test substrates transferred to the selected processing chamber may be, for example, one or two or more.

Specifically, in the wafer transfer in lot units, all substrates in a lot are transferred only to the selected one processing chamber. The wafer transfer may thus minimally require only one test substrate, thus reducing cost.

The storage unit may store an order of such of the processing chambers as are used to process the substrate, the selection unit may select, according to the order of the processing chambers stored in the storage unit, the processing chamber that has spent most amount of time since a last process among a processing chamber group specified in a recipe, and the transfer control unit may sequentially transfer the substrates in the selected units to the selected processing chamber.

The substrates in the selected units are thus transferred to the processing chamber that has spent the most amount of time since the last process among the processing chamber group specified in the recipe. The variation in the frequency of use of the processing chambers may thus be reduced, thereby using a plurality of processing chambers at frequencies as close as possible. The variation in the atmosphere in the processing chambers may thus be reduced. The variation in the substrate processes performed in the processing chambers may then be minimized.

The storage unit may store, for each processing chamber, the total number of substrates processed in each processing chamber before each processing chamber is cleaned, the selection unit may select, according to the total number of substrates processed that is stored in the storage unit, the processing chamber that has processed minimum number of substrates among a processing chamber group specified in a recipe, and the transfer control unit may sequentially transfer the substrates in the selected units to the selected processing chamber.

The substrates in the selected units are thus transferred to the processing chamber that has processed the minimum number of substrates among the processing chamber group specified in the recipe. Again, the variation in the frequency of use of the processing chambers may thus be reduced, thereby using a plurality of processing chambers at frequencies as close as possible. The variation in the atmosphere in the processing chambers may thus be reduced. The variation in the substrate processes performed in the processing chambers may then be minimized.

The storage unit may store, for each processing chamber, the total amount of time spent in processing the substrates in each processing chamber before each processing chamber is cleaned, the selection unit may select, according to the total amount of time spent in processing the substrates that is stored in the storage unit, the processing chamber that has spent least amount of time in processing the substrates among a processing chamber group specified in a recipe, and the transfer control unit may sequentially transfer the substrates in the selected units to the selected processing chamber.

The substrates in the selected units are thus transferred to the processing chamber that has spent the least amount of time in processing the substrates among the processing chamber group specified in the recipe. Once again, the variation in the frequency of use of the processing chambers may thus be reduced, thereby using a plurality of processing chambers at frequencies as close as possible. The variation in the atmosphere in the processing chambers may thus be reduced. The variation in the substrate processes performed in the processing chambers may then be minimized.

When the selection unit selects the one-lot units, the transfer control unit may sequentially transfer all substrates included in a lot to the selected processing chamber, and when the selection unit selects the one-substrate units, the transfer control unit may transfer a first substrate included in the lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and the transfer control unit may repeatedly transfer a next substrate included in the lot to a next processing chamber until a last substrate included in the lot.

When, therefore, the one-lot units are selected as the transfer procedure, all substrates included in a lot are sequentially transferred to the same processing chamber. This may thus reduce the variation in the substrate processes due to the different processing chambers, thereby performing uniform and high-quality processes to the substrates included in the relevant lot.

When the one-substrate units are selected as the transfer procedure, the substrates included in a lot are sequentially transferred to the different processing chambers one by one. Specifically, the substrates are transferred to a processing chamber selected from the processing chamber that has spent the most amount of time at that point since the last process, the processing chamber that has processed the minimum number of substrates at that point, and the processing chamber that has spent the least amount of time at that point in processing the substrates, and the next substrate included in the relevant lot is transferred to the next processing chamber. The above operation is repeated until the last substrate included in the relevant lot. A plurality of substrates may thus be processed in a plurality of processing chambers at the same time, thereby increasing the throughput of the substrate process and the productivity of the products.

Another embodiment of the present invention provides a method for controlling a substrate processing apparatus, the apparatus including a plurality of processing chambers that perform a specified process on a substrate and a transfer mechanism that transfers the substrate, the method including: selecting a processing chamber to which a next substrate is to be transferred, and selecting whether the substrates are transferred to the same processing chamber in one-lot units or in one-substrate units depending on a degree of microfabrication requested for each substrate lot; and sequentially transferring the substrates in the selected units to the selected processing chamber.

Still another embodiment of the present invention provides a storage medium storing a control program that instructs a computer to control a substrate processing apparatus including a plurality of processing chambers that perform a specified process on a substrate and a transfer mechanism that transfers the substrate, the control program including instructions that command the computer to execute the steps of: selecting a processing chamber to which a next substrate is to be transferred, and selecting whether the substrates are transferred to the same processing chamber in one-lot units or in one-substrate units depending on a degree of microfabrication requested for each substrate lot; and sequentially transferring the substrates in the selected units to the selected processing chamber.

All substrates in a lot may thus be processed in the same processing chamber, thereby uniformly processing all substrates in one lot in the same atmosphere. This may thus manufacture, from all substrates included in one lot, the same products having no variation in the characteristics.

Thus, the present invention may control the change of the transfer method depending on the degree of the microfabrication requested for each lot.

DETAILED DESCRIPTION OF THE EMBODIMENTS

Figure 1:
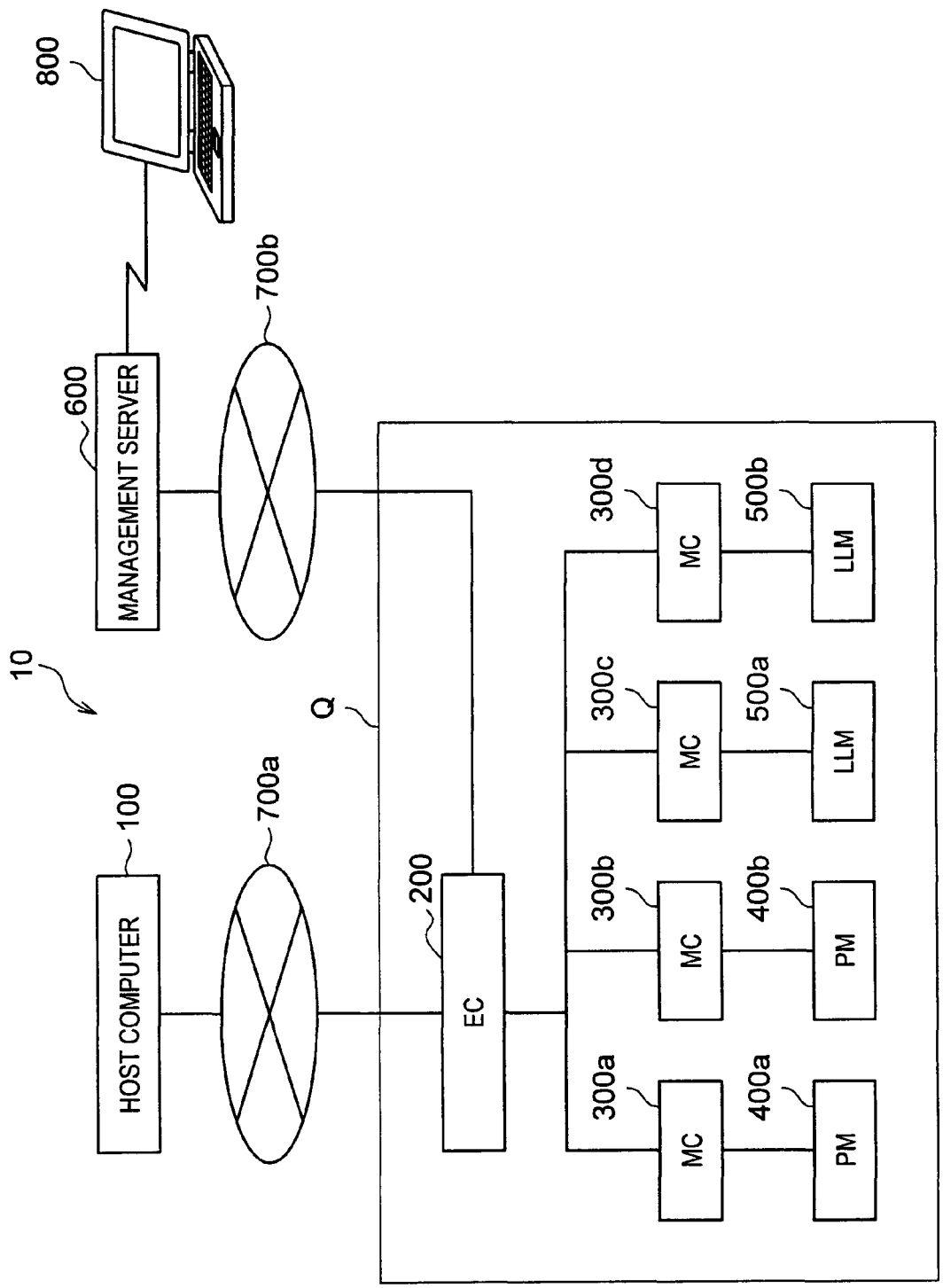
FIG. 1 is a schematic diagram of a substrate processing system according to a first to a third embodiment of the present invention.

Hereinafter, a preferred embodiment of the present invention will be described in detail with reference to the appended drawings. Note that, in this specification and the appended drawings, structural elements that have substantially the same function and structure are denoted with the same reference numerals, and repeated explanation of these structural elements is omitted.

The First Embodiment

First, a general description of a substrate processing system according to the first embodiment of the present invention will be provided with reference to FIG. 1. Note that in the present embodiment, a process that uses the substrate processing system to etch a silicon wafer (hereinafter called the "wafer") will be used as an example for explanatory purposes.

(Substrate Processing System)

A substrate processing system 10 includes a host computer 100, an equipment controller (hereinafter called the "EC") 200, four machine controllers (hereinafter called the "MCs") 300a to 300d, two process modules (hereinafter called the "PMs") 400a and 400b, two load lock modules (hereinafter called the "LLMs") 500a and 500b, and a management server 600.

The host computer 100 and the EC 200 are connected by a client local area network (LAN) 700a, and the EC 200 and the management server 600 are connected in a client LAN 700b. In addition, the management server 600 is connected to an information processing device, such as a personal computer (PC) 800 or the like. An operator sends instructions to the substrate processing system 10 by operating the PC 800.

The EC 200, the MCs 300a to 300d, the PMs 400a, 400b and the LLMs 500a, 500b are provided in a specified area Q within a plant and are connected by in-plant LANs respectively.

The host computer 100 controls the entire substrate processing system 10, including data control and the like. The EC 200 holds a system recipe that is used for the process of etching a substrate. The EC 200 transmits control signals to each of the MCs 300 so as to operate the PMs 400a, 400b and LLMs 500a, 500b according to the system recipe. The EC 200 also performs revision history control.

The MCs 300a to 300d hold the process recipe, and control the process of the wafer W, by respectively driving each device provided to the PMs 400a, 400b according to the procedure of the process recipe, based on the control signals that are transmitted from the EC 200. The MCs 300a to 300d control the transfer of the wafer W by respectively driving each device provided to LLMs 500a, 500b.

The PMs 400a and 400b are vacuum processing chambers that provide the wafer W with a specified process such as an etching process. The LLMs 500a and 500b are transfer chambers having transfer mechanisms that transfer the wafer W. A substrate processing apparatus includes the PMs 400a and 400b and the LLMs 500a and 500b and operates them to process the substrate. The substrate processing apparatus will be described later. The management server 600 sets, according to data from the PC 800 by the operator, the operation condition of each unit or the like.

(Hardware Configurations of the EC and MC)

Next, the hardware configuration of the EC 200 will be explained with reference to FIG. 2. Note that the hardware configurations of the MCs 300 are the same as that of the EC 200, so explanation of these configurations is omitted.

Figure 2:
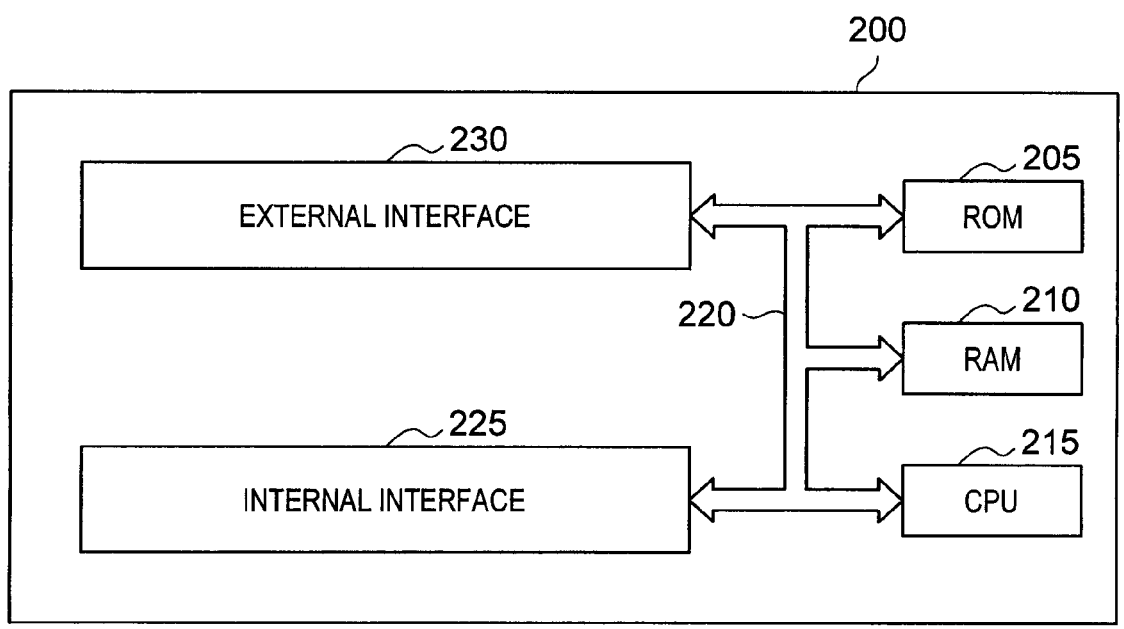
FIG. 2 is a hardware configuration diagram of an EC according to the first to third embodiments of the present invention.

As shown in FIG. 2, the EC 200 includes a ROM 205, a RAM 210, a CPU 215, a bus 220, an internal interface (internal I/F) 225, and an external interface (external I/F) 230.

A basic program that is run by the EC 200, a program that is run when an abnormality occurs, various types of recipes, and the like are stored in the ROM 205. Various types of programs and data are stored in the RAM 210. Note that the ROM 205 and the RAM 210 are examples of storage devices and may be storage devices such as EEPROMs, optical disks, magneto-optical disks, and the like.

The CPU 215 controls the substrate processing according to the various types of recipes. The bus 220 is the path by which data is exchanged among the ROM 205, the RAM 210, the CPU 215, the internal interface 225, and the external interface 230.

The internal interface 225 inputs data and outputs required data to a monitor, a speaker, and the like that are not shown in the drawings. The external interface 230 transmits and receives data among devices that are connected in a network such as a LAN or the like.

(Hardware Configurations of the Substrate Processing Apparatus)

Next, the hardware configurations of the substrate processing apparatus including the PMs 400 and the LLMs 500, will be explained with reference to FIG. 3. The substrate processing apparatus includes a first process ship Q1, a second process ship Q2, a transfer unit Q3, an alignment mechanism Q4, and a cassette stage Q5.

The first process ship Q1 includes the PM 400a and the LLM 500a. The second process ship Q2 is arranged parallel to the first process ship Q1 and includes the PM 400b and the LLM 500b.

The LLMs 500a, 500b transfer the wafer W by the use of the transfer arms Arma and Armb disposed in the LLMs 500a, 500b respectively, between the transfer unit Q3, which is open to the atmosphere, and the PMs 400a, 400b, which are in a vacuum state, while adjusting the internal pressure by the opening and closing of gate valves V which are provided at both ends of the LLMs 500a, 500b and can open and close in an airtight manner. Note that details of the internal structure of the PMs 400 will be described later.

The transfer unit Q3 is a rectangular transfer chamber and is connected to the first process ship Q1 and the second process ship Q2. The transfer unit Q3 is provided with a transfer arm Armc, and the arm Armc is used to transfer the wafer W to the first process ship Q1 and the second process ship Q2 in cooperation with the transfer arms Arma and Armb.

The alignment mechanism Q4, which performs aligning of the wafer W, is provided at one end of the transfer unit Q3. The alignment mechanism Q4 aligns the wafer W by rotating a rotating platform Q4a on which the wafer W is placed and using an optical sensor Q4b to detect the state of the outer edge of the wafer W.

The cassette stage Q5 is provided on a longitudinal side surface of the transfer unit Q3. Three cassette holders LP1 to LP3 are placed on the cassette stage Q5. A maximum of twenty-five wafers W, for example, is accommodated on a plurality of levels in each cassette holder LP.

In this configuration, the 25 wafers W in the cassette holder LP1, for example, are transferred one by one by the transfer arm Armc from the cassette holder LP1 via the alignment mechanism Q4 to the process ships Q1 and Q2 alternately. The wafers are then transferred by the transfer arm Arma or Armb to the PM 400a or 400b, respectively. After the etching process, the wafers are accommodated again in the cassette holder LP1. The transfer method where the wafers W are thus transferred one by one to the PMs 400a and 400b alternately is referred to as the OR transfer.

(Internal Structure of PM)

Figure 4:
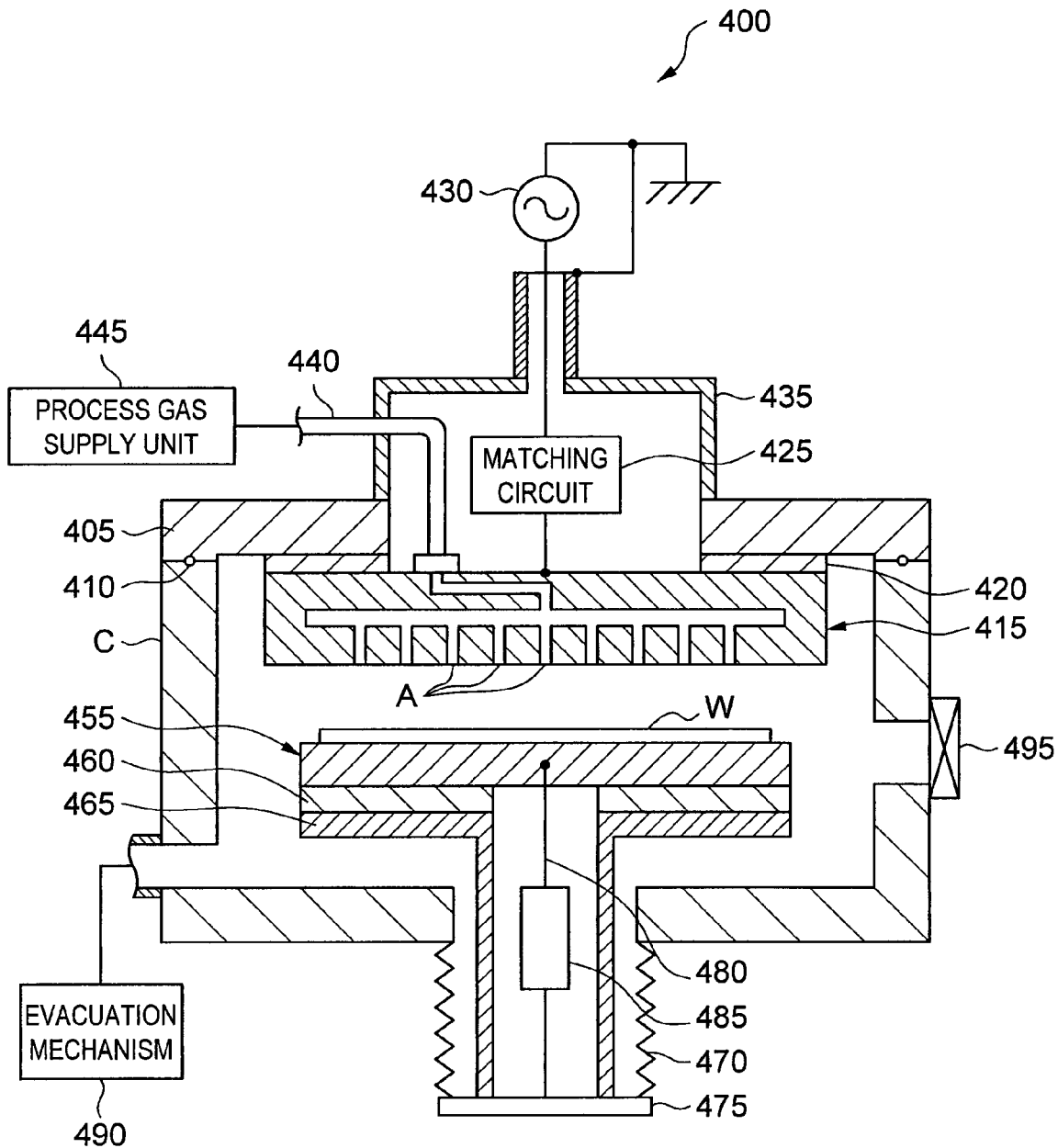
FIG. 4 is a schematic vertical cross-sectional view of a PM according to the first to third embodiments of the present invention.

FIG. 4 schematically shows a vertical cross-sectional view of the PM 400. With reference to FIG. 4, the internal structure of the PM 400 will be described. The PM 400 includes a processing chamber C of the rectangular tube shape. The chamber C has a ceiling and a bottom with openings formed in the substantially center portions thereof. The processing chamber C includes a lid 405 on the ceiling. The lid 405 has an opening at the substantially center portion of the ceiling. An O-ring 410 is provided in the contact surface between the upper portion of the side wall of the processing chamber C and the lower portion of the periphery of the lid 405. The O-ring 410 maintains the airtightness of the processing chamber.

An upper electrode 415 is provided in an upper portion of the interior of the processing chamber C. The upper electrode 415 is electrically isolated from the processing chamber C by an insulating material 420 that is provided around the edge of the opening in the top portion of the processing chamber C.

A high-frequency power supply 430 is connected to the upper electrode 415 through a matching circuit 425. A matching box 435 surrounds the matching circuit 425 and is provided to a substantially center portion of the ceiling to serve as a grounded housing for the matching circuit 425 and seal-up the ceiling.

A processing gas supply unit 445 is connected to the upper electrode 415 through a gas line 440. A desired processing gas that is supplied by the processing gas supply unit 445 is introduced into the processing chamber C through a plurality of gas injection holes A. Thus the upper electrode 415 functions as a gas shower head.

A lower electrode 455 is provided in a lower portion of the interior of the processing chamber C. The lower electrode 455 functions as a susceptor on which the wafer W is placed. The lower electrode 455 is supported with a support member 465 through an insulating material 460. The lower electrode 455 is thus electrically isolated from the processing chamber C.

One end of a bellows 470 is attached close to the perimeter of the opening that is provided in the bottom face of the processing chamber C. A raising and lowering plate 475 is securely fixed to the other end of the bellows 470. According to this configuration, the opening in the bottom face of the processing chamber C is sealed by the bellows 470 and the raising and lowering plate 475. Furthermore, the bellows 470 and the raising and lowering plate 475 move up and down as a single unit with the lower electrode 455 to adjust the position of the lower electrode 455 on which the wafer W is placed to a height that is appropriate to the processing.

The lower electrode 455 is connected to the raising and lowering plate 475 through an electrically conductive path 480 and an impedance adjustment unit 485. The upper electrode 415 and the lower electrode 455 respectively correspond to a cathode electrode and an anode electrode. The pressure in the interior of the processing chamber C is lowered to a desired degree of vacuum by an evacuation mechanism 490. According to this configuration, with the wafer W having been transferred into the interior of the processing chamber C, high-frequency electric power is applied to generate a plasma from the gas that is supplied to the interior of the processing chamber C, while the airtightness of the processing chamber C is maintained by the opening and closing of a gate valve 495. The desired etching is performed on the wafer W by the action of the generated plasma.

(Function Configuration of EC)

Figure 5:
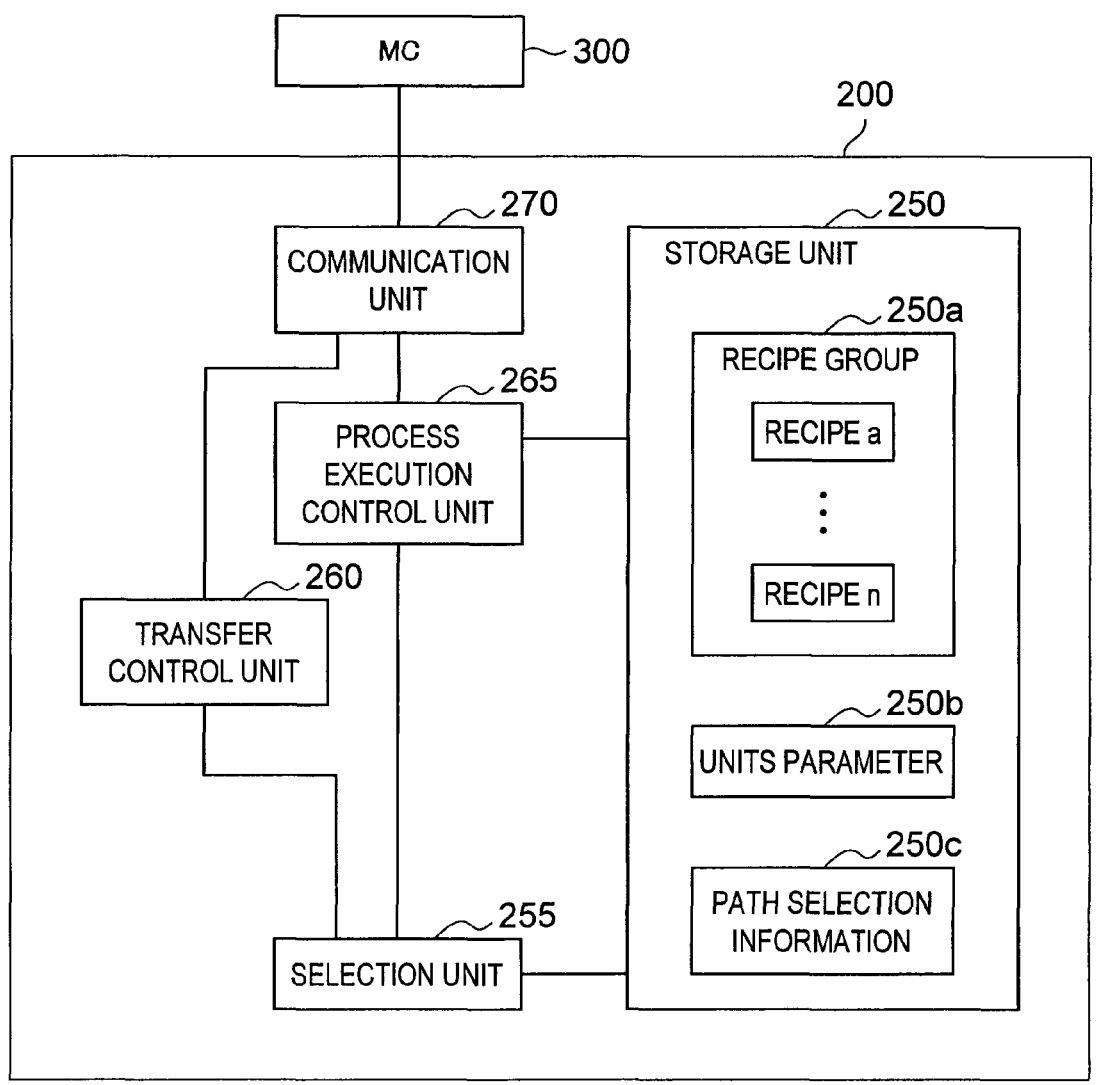
FIG. 5 is a function configuration diagram of an EC according to the first to third embodiments of the present invention.

FIG. 5 is a block diagram of functions of the EC 200. With reference to FIG. 5, the function configuration of the EC is described below. The EC 200 has functions shown by blocks including a storage unit 250, a selection unit 255, a transfer control unit 260, a process execution control unit 265, and a communication unit 270.

The storage unit 250 stores various recipes (recipe a to recipe n) as a recipe group 250a. The recipes show processing procedures to provide the wafer W with desired processes in each PM 400. The storage unit 250 also stores a units parameter 250b. The parameter 250b indicates whether a microfabrication process is requested. The storage unit 250 further stores path selection information 250c necessary to select a transfer path for the wafer W. The path selection information 250c may be, for example, the order of PMs that have etched the wafers W. The path selection information 250c may also be the total number of wafers W processed in each PM before each PM is cleaned. The path selection information 250c may also be the total amount of time spent in processing the wafers W in each PM before each PM is cleaned.

The selection unit 255 selects the PM to which the next wafer W is to be transferred. The unit 255 also selects for each lot, depending on the degree of the microfabrication requested for each lot, whether the substrates are transferred to the same processing chamber in one-lot units or in one-substrate units.

As the PM to which the next wafer W is to be transferred, the selection unit 255 selects, for example, according to the order of the PMs stored in the storage unit 250, the PM 400 that has spent the most amount of time since the last process among the PM group specified in the recipe (for example, the PM 400a and the PM 400b are specified).

Also as the PM to which the next wafer W is to be transferred, the selection unit 255 may select, according to the total number of wafers W processed that is stored in the storage unit 250, the PM 400 that has processed the minimum number of wafers among the PM group specified in the recipe. The selection unit 255 may also select, according to the total amount of time spent in processing the wafers W stored in the storage unit 250, the PM 400 that has spent the least amount of time in processing the wafers W among the PM group specified in the recipe.

The transfer control unit 260 sequentially transfers the wafers W in the units selected by the selection unit 255 to the PM 400 selected by the selection unit 255. Specifically, when the selection unit 255 selects one-lot units, the transfer control unit 260 sequentially transfers all wafers W in the relevant lot only to, for example, the PM 400a (not to the PM 400b) specified as the next processing chamber to be selected.

When the selection unit 255 selects one-wafer units, the transfer control unit 260 operates as follows. The control unit 260 transfers the first wafer in the relevant lot to the PM 400 that has spent the most amount of time since the last process (or the PM 400 that has processed the minimum number of wafers or the PM 400 that has spent the least amount of time in processing the wafers). The unit 260 then transfers the next wafer in the relevant lot to the next PM. The transfer control unit 260 repeats this transfer method until the last wafer in the relevant lot.

The process execution control unit 265 selects the recipe specified by the operator in the storage unit 250. The control unit 265 then generates a control signal to etch the wafer W transferred to the PM 400 by the transfer control unit 260. The etching is performed according to the procedure shown in the selected recipe.

The communication unit 270 transmits and receives information mainly from the MC 300. The communication unit 270 sends, for example, the control signal generated by the process execution control unit 265 to the MC 300. The unit 270 thus instructs the MC 300 to perform the desired etching process in the PM 400.

Note that the functions of the units in the EC 200 are actually provided as follows. A program (including a recipe) that describes the procedure in which the CPU 215 in FIG. 2 provides the functions is stored in storage media such as the ROM 205 and the RAM 210. The CPU 215 reads the program from the storage media. The CPU 215 then interprets the program and runs it to provide the functions. In this embodiment, for example, the functions of the selection unit 255, the transfer control unit 260, and the process execution control unit 265 are actually provided by the CPU 215 running a program that describes the procedure in which the CPU 215 provides these functions.

(Operation of EC)

Figure 6:
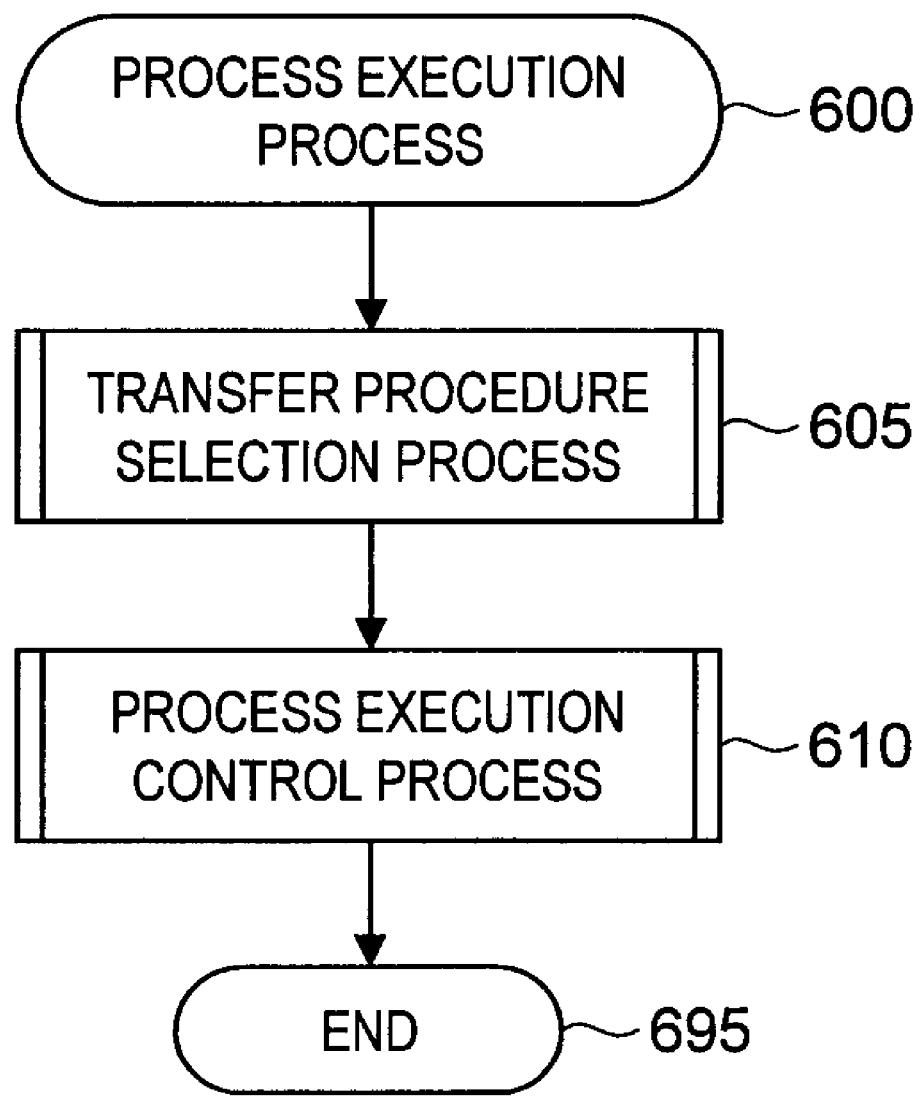
FIG. 6 is a flowchart of a process execution process routine (main routine) performed in the first to third embodiments.
Figure 7:
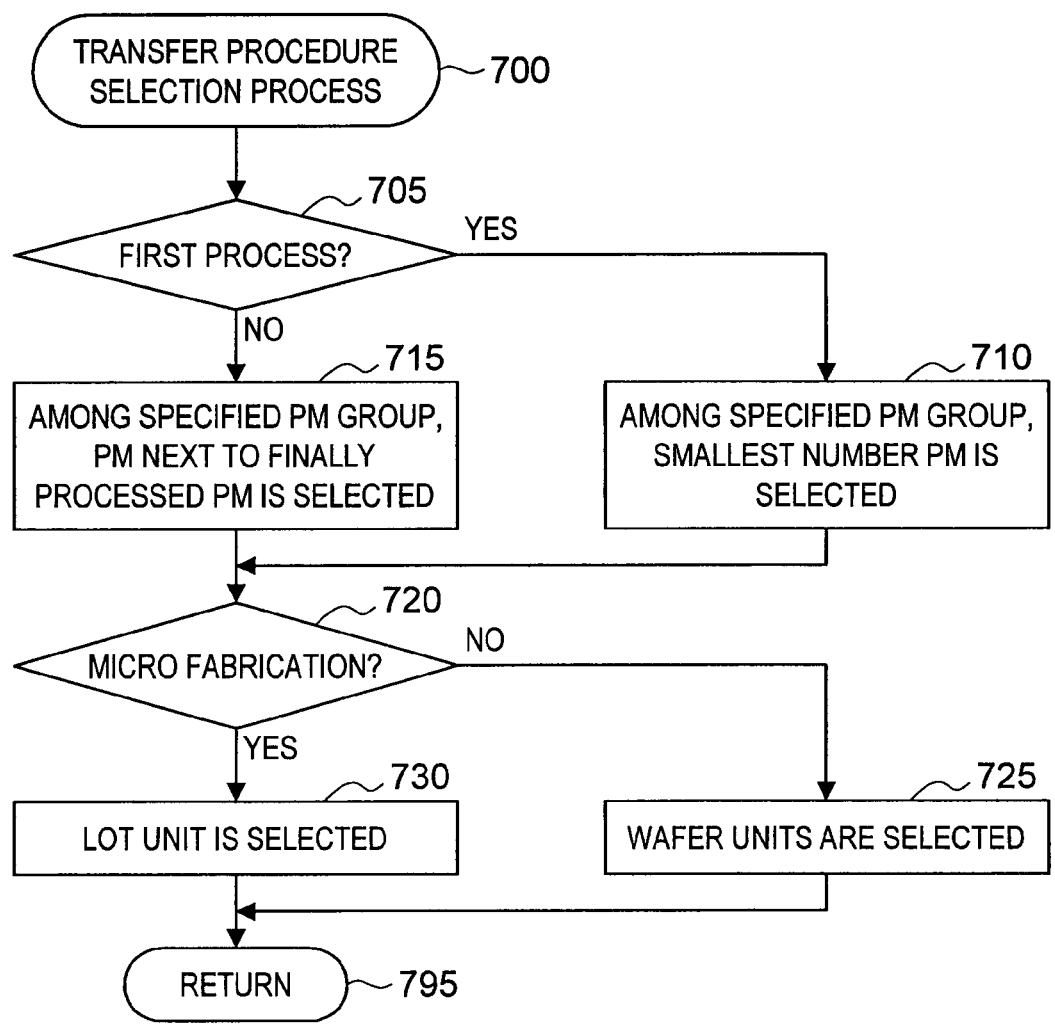
FIG. 7 is a flowchart of a transfer procedure selection process routine (sub routine) performed in the first embodiment of the present invention.
Figure 8:
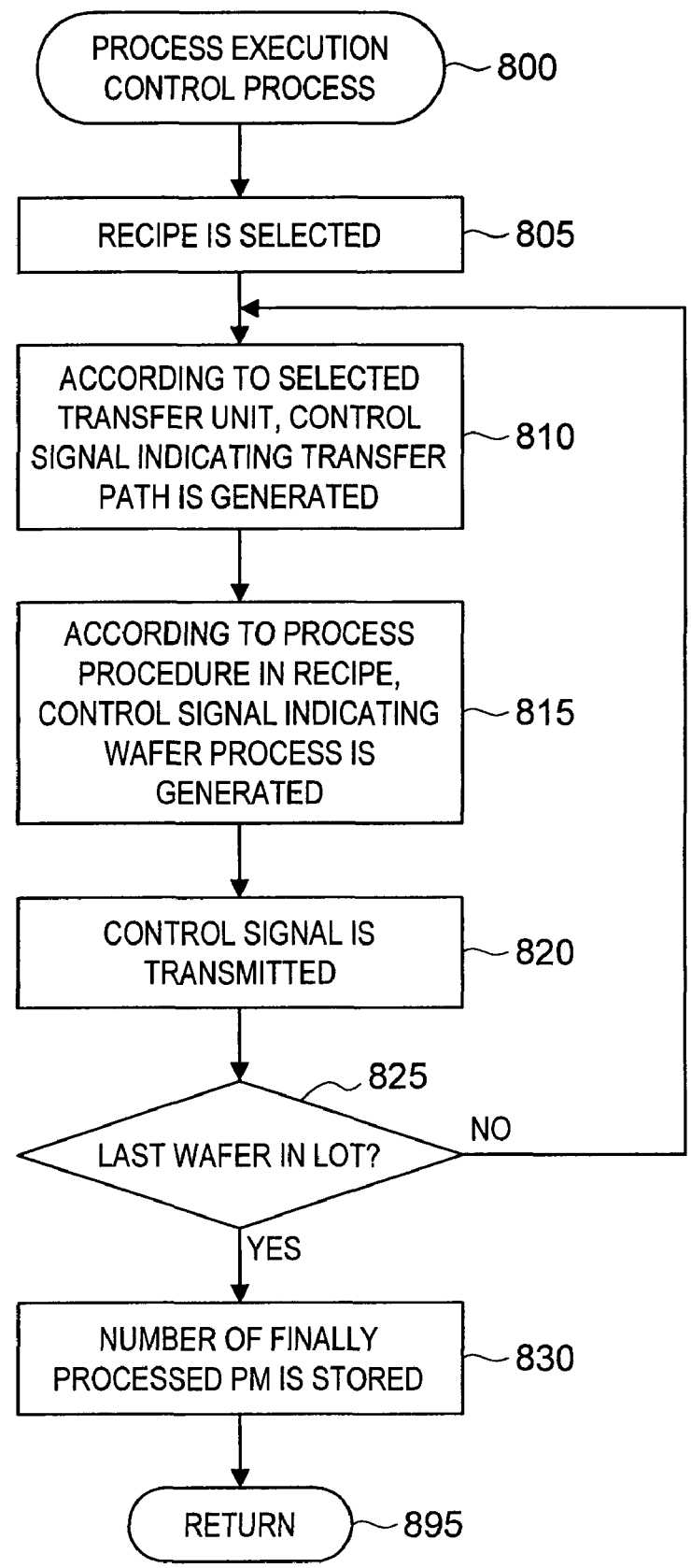
FIG. 8 is a flowchart of a process execution control process routine (sub routine) performed in the first embodiment of the present invention.

With reference to the flowcharts shown in FIGS. 6 to 8, the process execution process performed by the EC 200 will be described mainly with respect to a transfer procedure selection process in this embodiment. FIG. 6 shows a main routine showing the process execution process. FIG. 7 shows a sub routine showing the transfer procedure selection process called in the process execution process. FIG. 8 shows a sub routine showing a process execution control process called in the process execution process after the transfer procedure selection process.

The operator specifies the recipe a and the lot number and turns "on" the lot start button. The relevant lot is then introduced into the process. The lot is thus ready to have its 25 wafers sequentially transferred. The process execution process then starts at step 600 in FIG. 6. Step 605 calls the transfer procedure selection process. After the transfer procedure selection process is ended, control passes to step 610, where the process execution control process is called. After the process execution control process is ended, control passes to step 695, where the process execution process is ended.

(Transfer Procedure Selection Process)

In FIG. 6, step 605 calls the transfer procedure selection process. In FIG. 7, the transfer procedure selection process starts at step 700. Control then passes to step 705, where the selection unit 255 determines whether the transfer procedure selection process is performed for the first time after the system starts. When the substrate processing apparatus is in idle state, the selection unit 255 determines that the process is performed for the first time after the system starts. Control then passes to step 710, where the selection unit 255 selects the smallest number PM 400 among the PM group specified in the recipe. Assume here that the recipe specifies the PM 400a and the PM 400b. The selection unit 255 then selects the smallest number PM 400a.

When the transfer procedure selection process is not performed for the first time, control passes to step 715. In step 715, the selection unit 255 selects, among the PM group specified in the recipe, the PM 400 next to the PM 400 that has finally processed the wafer W. When, for example, the PM 400b has finally processed the wafer W, the selection unit 255 selects the PM 400a at step 715.

After step 710 or 715 thus selects the PM 400 to which the next wafer W is to be transferred, control passes to step 720. In step 720, the selection unit 255 determines whether the microfabrication is requested. Specifically, the selection unit 255 determines whether the units parameter stored in the storage unit 250 is valid.

When the microfabrication process is not requested (i.e., the units parameter is invalid), control passes to step 725. In step 725, the selection unit 255 selects wafer units as the transfer units. Control then passes to step 795, where the transfer procedure selection process is ended. When, at step 720, the microfabrication process is requested (i.e., the units parameter is valid), control passes to step 730. In step 730, the selection unit 255 selects lot units as the transfer units. Control then passes to step 795, where the transfer procedure selection process is ended.

As described above, whether the microfabrication process is requested or not may be determined as follows. The operator specifies in advance the units parameter as valid or invalid. When the units parameter is valid, it is determined that the microfabrication process is requested. When the units parameter is invalid, it is determined that the microfabrication process is not requested. Alternatively, the microfabrication request may be determined considering the recipe type specified by the operator or the recipe content.

(Process Execution Control Process)

After the transfer procedure selection process in FIG. 7 is ended, step 610 in FIG. 6 calls the process execution control process in FIG. 8. Accordingly, the process execution control process starts at step 800 in FIG. 8. Control then passes to step 805, where the process execution control unit 265 selects the recipe a specified by the operator from the recipe group stored in the storage unit 250.

Figure 9:
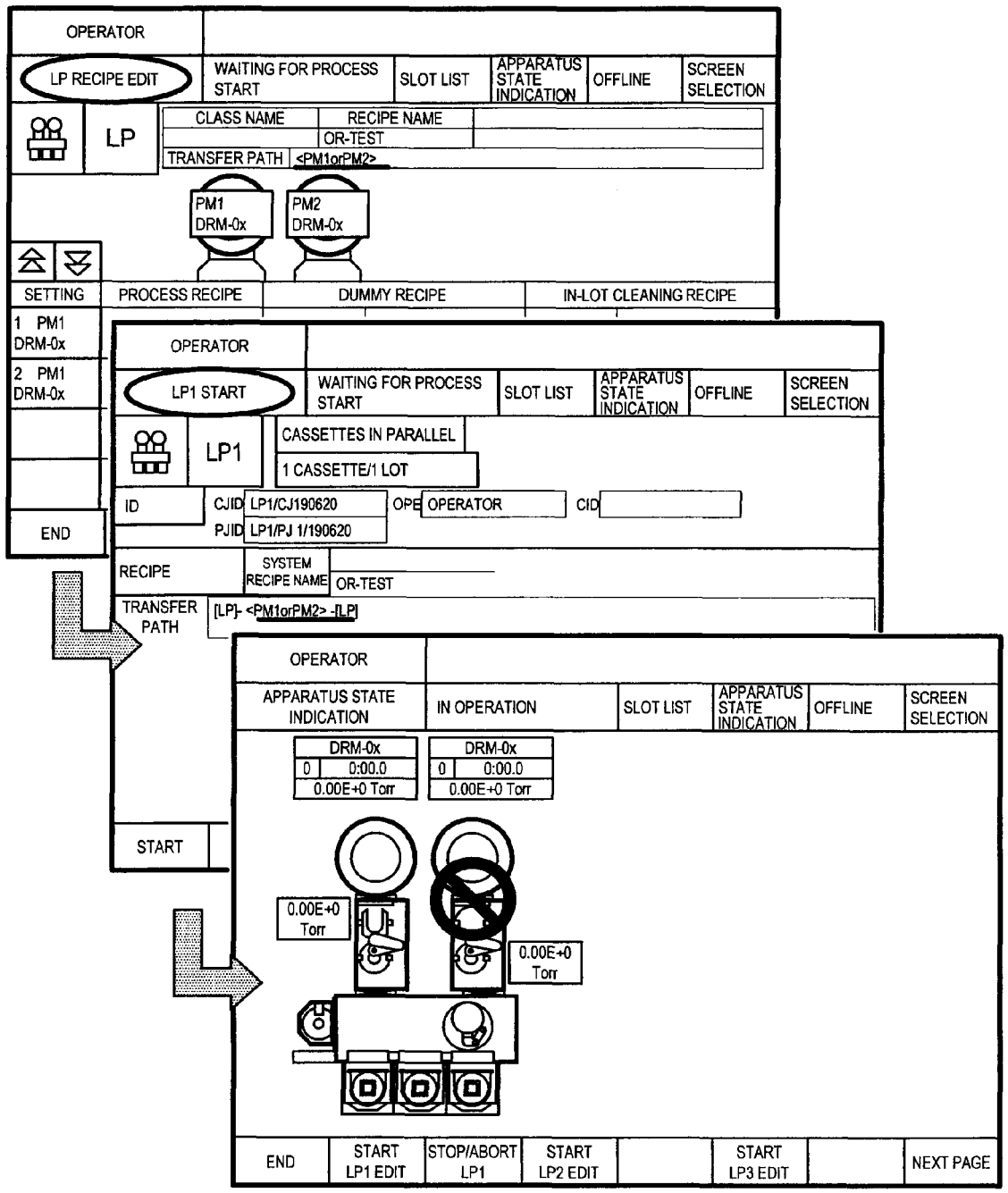
FIG. 9 shows a recipe edit screen, a start screen to start a lot of a cassette LP1, and a screen to indicate a state of a substrate processing apparatus.

Control then passes to step 810. In step 810, the transfer control unit 260 generates, according to the transfer units selected by the selection unit 255, a control signal indicating the transfer path. With reference to FIG. 9, for example, on a system recipe edit screen (upper screen), the operator creates a system recipe of an OR transfer path (i.e., PM1 or PM2). On a start screen (middle screen), the operator specifies the system recipe of the OR transfer path created on the screen (upper screen), and turns on "start." When the selection unit 255 selects the lot units, the transfer control unit 260 selects, as shown in the substrate processing apparatus state (lower screen), one PM (such as the PM1), as described above, among the specified PM group (PM1 or PM2) for OR transfer. The transfer control unit 260 then generates an control signal to sequentially transfer to the PM1 all wafers from the first to last wafer W in the relevant lot in order to etch all wafers W in the relevant lot in the PM1 (PM 400a). None of the wafers W in the relevant lot are thus transferred to the PM2 (PM 400b).

Control then passes to step 815, where the process execution control unit 265 generates an control signal indicating an etching process according to the processing procedure shown in the recipe a. Control then passes to step 820, where the communication unit 270 sends the generated control signal to the MC 300.

Control then passes to step 825, where the process execution control unit 265 repeats the processes at steps 810 to 825 until it is determined that the wafer is the last wafer W in the relevant lot. All wafers W in the relevant lot are thus etched in the PM 400a. After the last wafer is etched, control passes to step 830. In step 830, the final processing PM number "PM 400a" is stored as a piece of the path selection information. Control then passes to step 895, where the process execution control process is ended.

Figure 10:
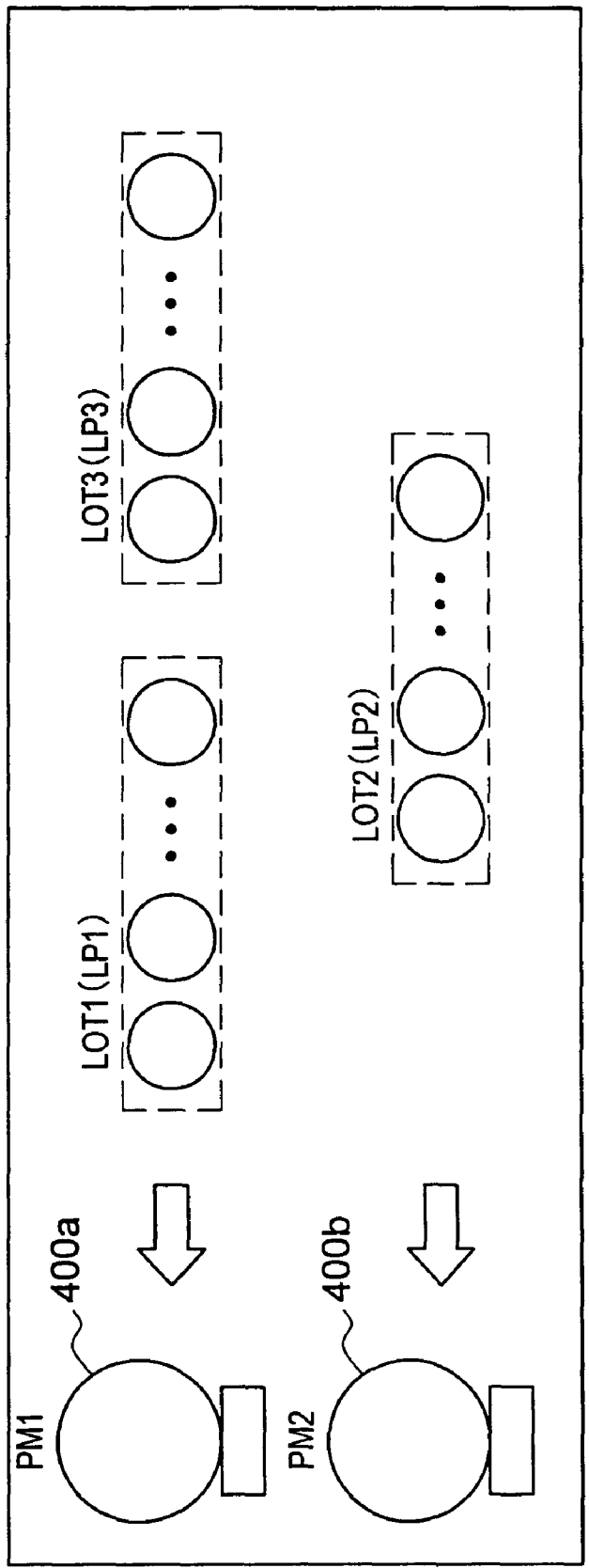
FIG. 10 illustrates wafers transferred in lot units.

When, for example, the lot 1, the lot 2, and the lot 3 accommodated in the LP1, the LP2, and the LP3, respectively, are all to be microfabricated, the wafers are processed as follows, as shown in FIG. 10. All wafers in the lot 1 are processed in the PM1 (PM 400a). All wafers in the lot 2 are processed in the processing chamber that has spent the most amount of time at that point since the last process, such as the PM2 (PM 400b). All wafers in the lot 3 are processed in the processing chamber that has spent the most amount of time at that point since the last process, such as the PM1 (PM 400a).

When the selection unit 255 selects the wafer units, the process execution control unit 265 generates, in step 810, an control signal instructing the OR transfer to the PM group specified in the system recipe. The control signal for the transfer thus generated in step 810 and the control signal for the process execution generated in step 815 are repeatedly sent to the MC 300 until the end of the lot. The first wafer W in the lot is thus transferred to the selected PM 400a. The next wafer W in the relevant lot is transferred to the next processing chamber such as the PM 400b. The next next wafer W in the relevant lot is transferred to the next next processing chamber such as the PM 400a. In this way, until the last wafer W in the relevant lot, the wafers W are OR-transferred one by one to the PMs 400a and 400b alternately. The PM 400s etch the wafers in parallel.

Thus, the wafer transfer in lot units may transfer all wafers W in a lot to the same PM where the wafers W are then processed. All wafers W in one lot may thus be uniformly processed under the same environment, thereby manufacturing the same products in one-lot units with no variation in characteristics. The OR transfer in wafer W units allows the wafers to be processed in parallel, thereby providing the higher throughput than the wafer transfer in lot units.

The transfer in wafer units transfers, before transferring the product wafers, test wafers one by one, for example, to each processing chamber of the PM group specified in the recipe. Specifically, in the OR transfer in wafer units, the processing chambers should be checked in advance for being ready for processing the product wafers. The check is done by transferring, before the product wafers, the test wafers to all processing chambers to which the product wafers are to be OR transferred. The OR transfer thus minimally requires the number of test wafers corresponding to all processing chambers to which the wafers are to be OR transferred.

In contrast, the wafer transfer in lot units transfers, before transferring the product substrates, only one test wafer, for example, to the PM selected by the selection unit 255. Specifically, the wafer transfer in lot units transfers all wafers W in a lot to the selected one processing chamber. The wafer transfer in lot units may thus minimally require only one test wafer W, thus reducing cost.

Second Embodiment

A substrate processing system 10 according to a second embodiment of the present invention will now be described. The PM 400 to which the next wafer is to be transferred is the PM 400 that has been least frequently used. As the latter PM 400, the second embodiment selects the PM 400 that has processed the minimum number of wafers W. The second embodiment thus differs from the first embodiment that selects the PM 400 that has spent the most amount of time since the last process. Focusing on the difference between the two embodiments, the substrate processing system 10 according to this embodiment will be described below with reference to FIGS. 11 and 12.

Figure 11:
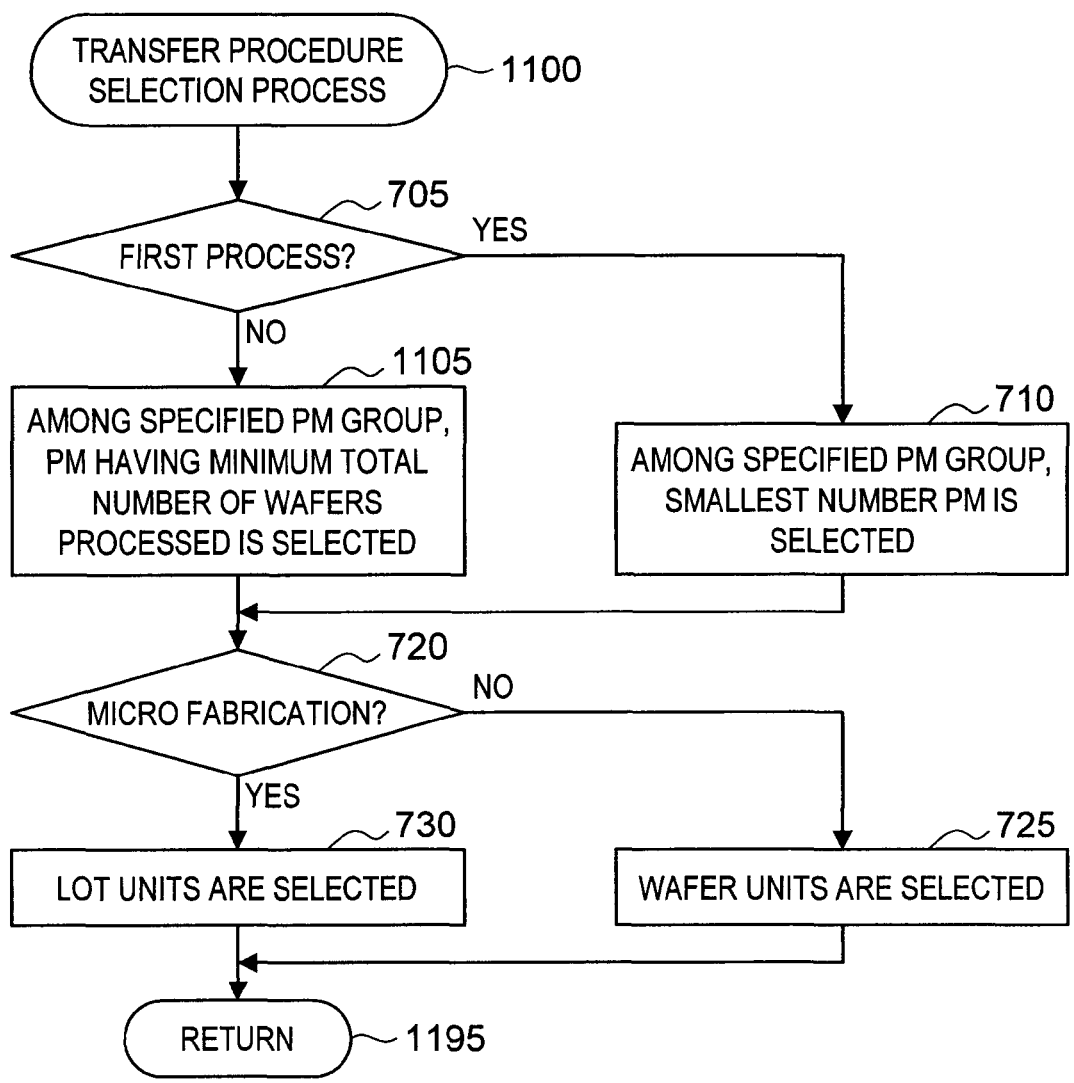
FIG. 11 is a flowchart of a transfer procedure selection process routine performed in the second embodiment of the present invention.

The second embodiment includes an EC, which has a function configuration similar to that of the EC 200 (FIG. 5) in the first embodiment. The second embodiment also includes a transfer procedure selection process in FIG. 11 and a process execution control process in FIG. 12. These processes are partially different from those (FIGS. 7 and 8) in the first embodiment, respectively. Specifically, the process execution process in FIG. 6 calls the transfer procedure selection process in FIG. 11. In FIG. 11, step 1100 is followed by step 705, which determines whether the transfer procedure selection process is performed for the first time. If so, control passes to step 710 as in the first embodiment. If not, control passes to step 1105, where the selection unit 255 selects, among the PM group specified in the system recipe, the PM 400 that has the minimum total number of wafers processed. Note that the total number of wafers processed is accumulated for each PM as a piece of the path selection information 250c in the storage unit 250.

After the PM to which the next wafer is to be transferred is thus selected, the selection unit 255 performs steps 720 to 730 as in the first embodiment. Control then passes to step 1195, where the transfer procedure selection process is ended.

Figure 12:
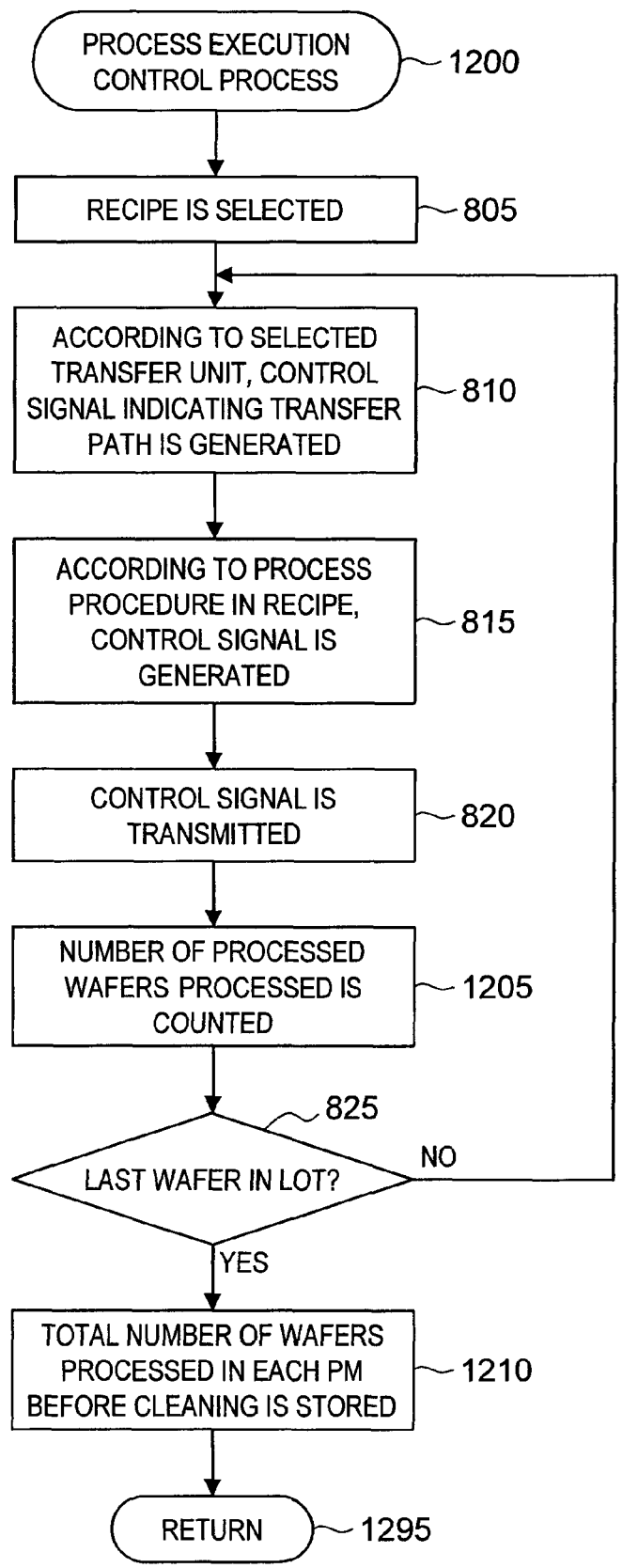
FIG. 12 is a flowchart of a process execution control process routine performed in the second embodiment of the present invention.

After the transfer procedure selection process in FIG. 11 is ended, the process execution process in FIG. 6 calls the process execution control process in FIG. 12. In FIG. 12, step 1200 is followed by steps 805 to 815, where the process execution control unit 265 generates a control signal to control the transfer and etching of the wafers W as in the first embodiment. Control then passes to step 820, where the communication unit 270 sends the generated control signal to the MC 300. Control then passes to step 1205, where the process execution control unit 265 counts the number of wafers processed in the relevant PM. Control then passes to step 825.

Step 825 determines whether the processed wafer W is the last wafer in the lot. If not, the process execution control unit 265 repeats steps 810 to 820 and 1205. If so, control passes to step 1210, where the storage unit 250 stores, for each PM 400, the total number of wafers processed in each PM 400 before each PM 400 is cleaned.

The substrates are therefore transferred to, among the PM group specified in the system recipe, the PM 400 that has processed the minimum number of wafers. The PM 400 that is expected to be least frequently used may thus process the wafers W. A plurality of PMs 400 may thus be used without the variation in the frequency of use, thereby performing the desired process as uniformly as possible in all PMs 400. Each PM 400 may thus have less variation in the atmosphere, thereby providing the least variation in the process in each PM 400.

Third Embodiment

A substrate processing system 10 according to a third embodiment of the present invention will now be described. The PM 400 to which the next wafer is to be transferred is the PM 400 that has been least frequently used. As the latter PM 400, the third embodiment selects the PM 400 that has spent the least amount of time in processing the wafers. The third embodiment thus differs from the second embodiment that selects the PM 400 that has processed the minimum number of wafers W. Focusing on the difference between the two embodiments, the substrate processing system 10 according to this embodiment will be described below with reference to FIGS. 13 and 14.

Figure 13:
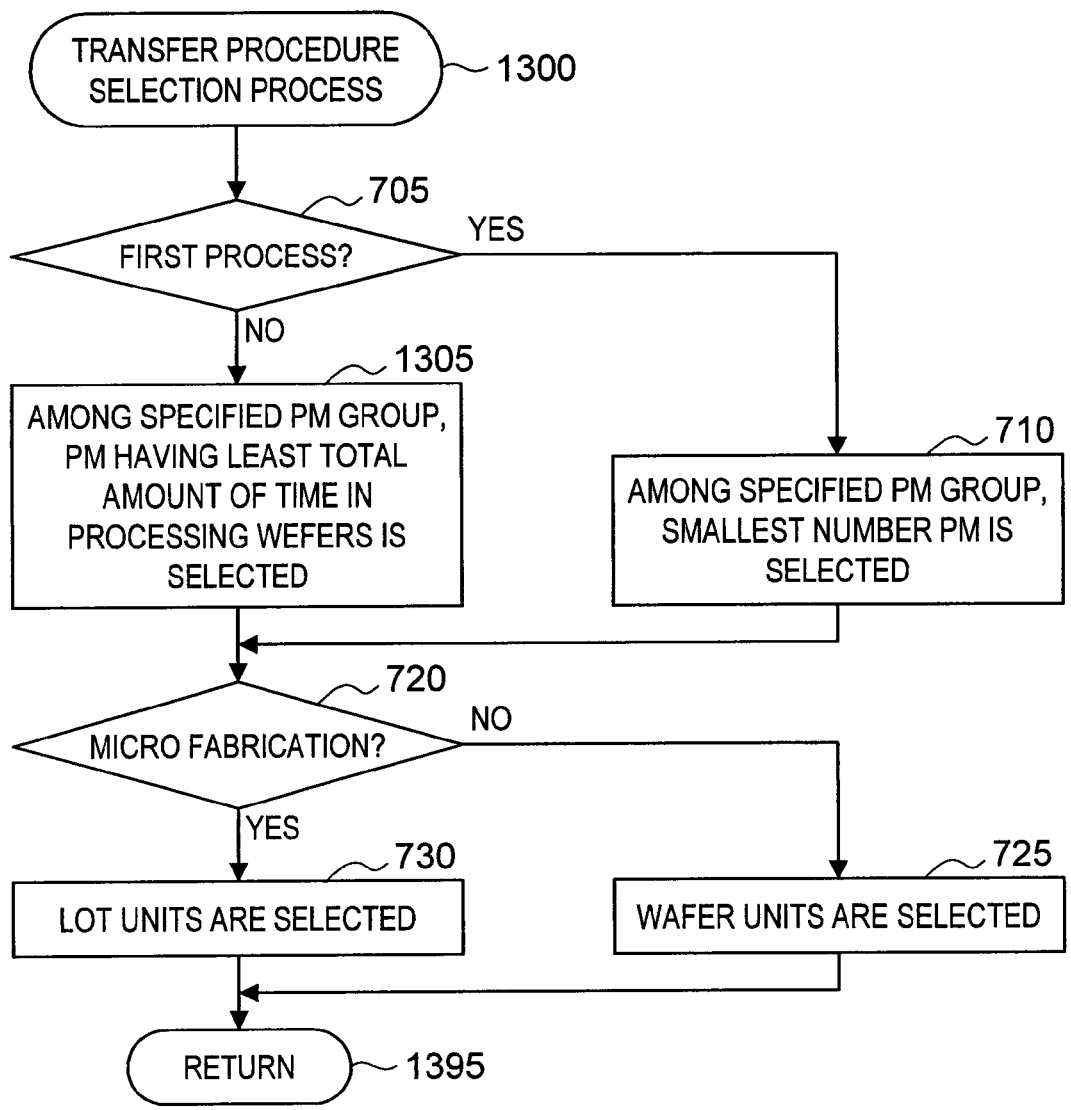
FIG. 13 is a flowchart of a transfer procedure selection process routine performed in the third embodiment of the present invention.

The third embodiment includes an EC, which has a function configuration similar to that of the EC 200 (FIG. 5) in the second embodiment. The third embodiment also includes a transfer procedure selection process in FIG. 13 and a process execution control process in FIG. 14. These processes are partially different from those (FIGS. 11 and 12) in the second embodiment, respectively. Specifically, the process execution process in FIG. 6 calls the transfer procedure selection process in FIG. 13. In FIG. 13, step 1300 is followed by step 705, which determines whether the transfer procedure selection process is performed for the first time. If so, control passes to step 710 as in the second embodiment. If not, control passes to step 1305, where the selection unit 255 selects, among the PM group specified in the system recipe, the PM 400 that has the least total amount of time spent in processing the wafers. Note that the total amount of time spent in processing the wafers is accumulated for each PM as a piece of the path selection information 250c in the storage unit 250.

After the PM to which the next wafer is to be transferred is thus selected, the selection unit 255 performs steps 720 to 730 as in the second embodiment. Control then passes to step 1395, where the transfer procedure selection process is ended.

Figure 14:
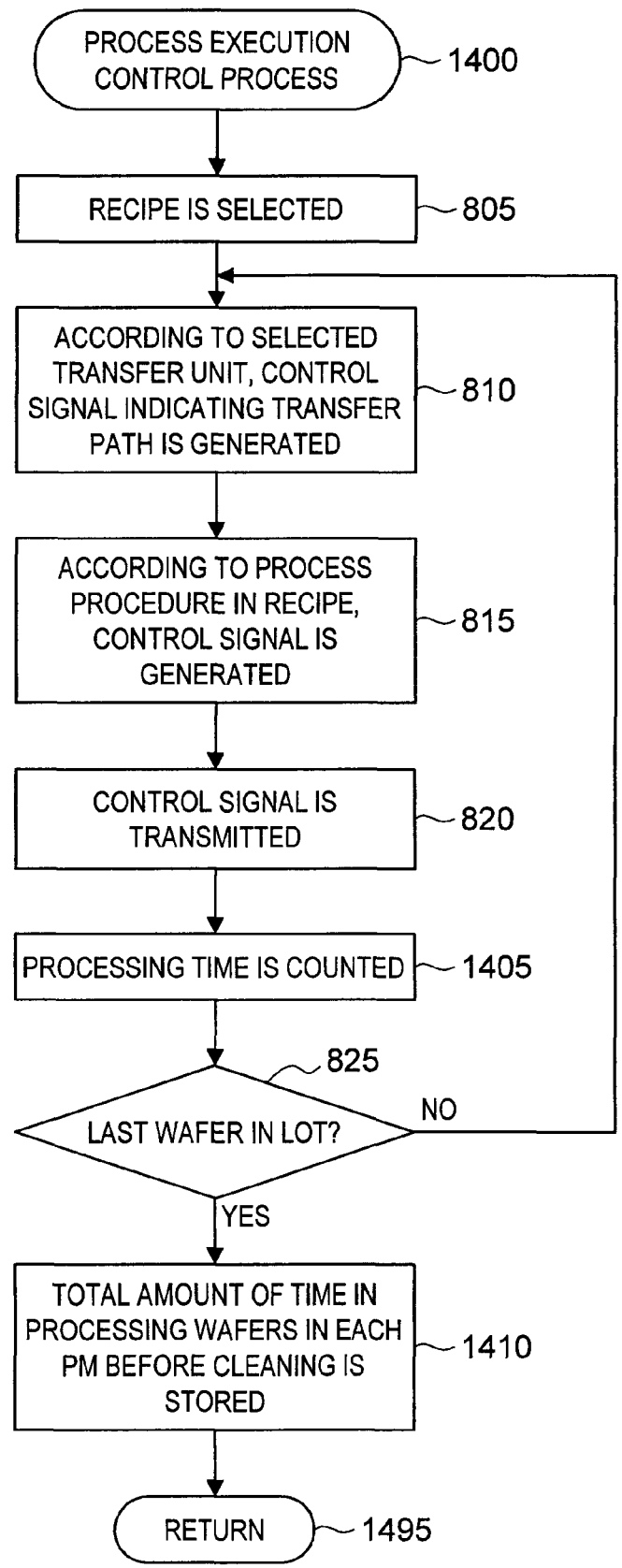
FIG. 14 is a flowchart of a process execution control process routine performed in the third embodiment of the present invention.

After the transfer procedure selection process in FIG. 13 is ended, the process execution process in FIG. 6 calls the process execution control process in FIG. 14. In FIG. 14, step 1400 is followed by steps 805 to 820, where the process execution control unit 265 generates a control signal to control the transfer and etching of the wafers W as in the second embodiment, and the communication unit 270 sends the generated control signal to the MC 300. Control then passes to step 1405, where the process execution control unit 265 counts the amount of time spent in processing the wafers in the relevant PM. Control then passes to step 825.

Step 825 determines whether the processed wafer W is the last wafer in the lot. If not, the process execution control unit 265 repeats steps 810 to 820 and 1405. If so, control passes to step 1410, where the storage unit 250 stores, for each PM 400, the total amount of time spent in processing the wafers in each PM 400 before each PM 400 is cleaned.

The substrates in the selected units are therefore transferred to, among the PM group specified in the system recipe, the PM 400 that has the least amount of time in processing the wafers. The PM 400 that is expected to be least frequently used may thus process the wafers W. A plurality of PMs 400 may thus be used without the variation in the frequency of use, thereby performing the desired process as uniformly as possible in all PMs 400. Each PM 400 may thus have less variation in the atmosphere, thereby providing the least variation in the process in each PM 400.

In the above embodiments, the operations of the units are related to each other. The operations may thus be replaced with a series of operations in consideration of the relations.

Thus, a method embodiment for controlling substrate processing apparatus can be led from the control device embodiment for substrate processing apparatus. The operations of the units may also be replaced with the processes by the units, thus a program embodiment for substrate processing apparatus can be led from the method embodiment for controlling substrate processing apparatus. The program may be stored in a computer-readable storage medium, thus changing the program embodiment to a computer-readable storage medium embodiment recording the program.

The preferred embodiment of the present invention has been described with reference to the appended drawings, but it is clearly apparent that the present invention is not limited by this example. It should be understood by those skilled in the art that various modifications, combinations, sub-combinations and alterations may occur depending on design requirements and other factors insofar as they are within the scope of the appended claims or the equivalents thereof.

(Example of Change of the Substrate Processing Apparatus)

Figure 3:
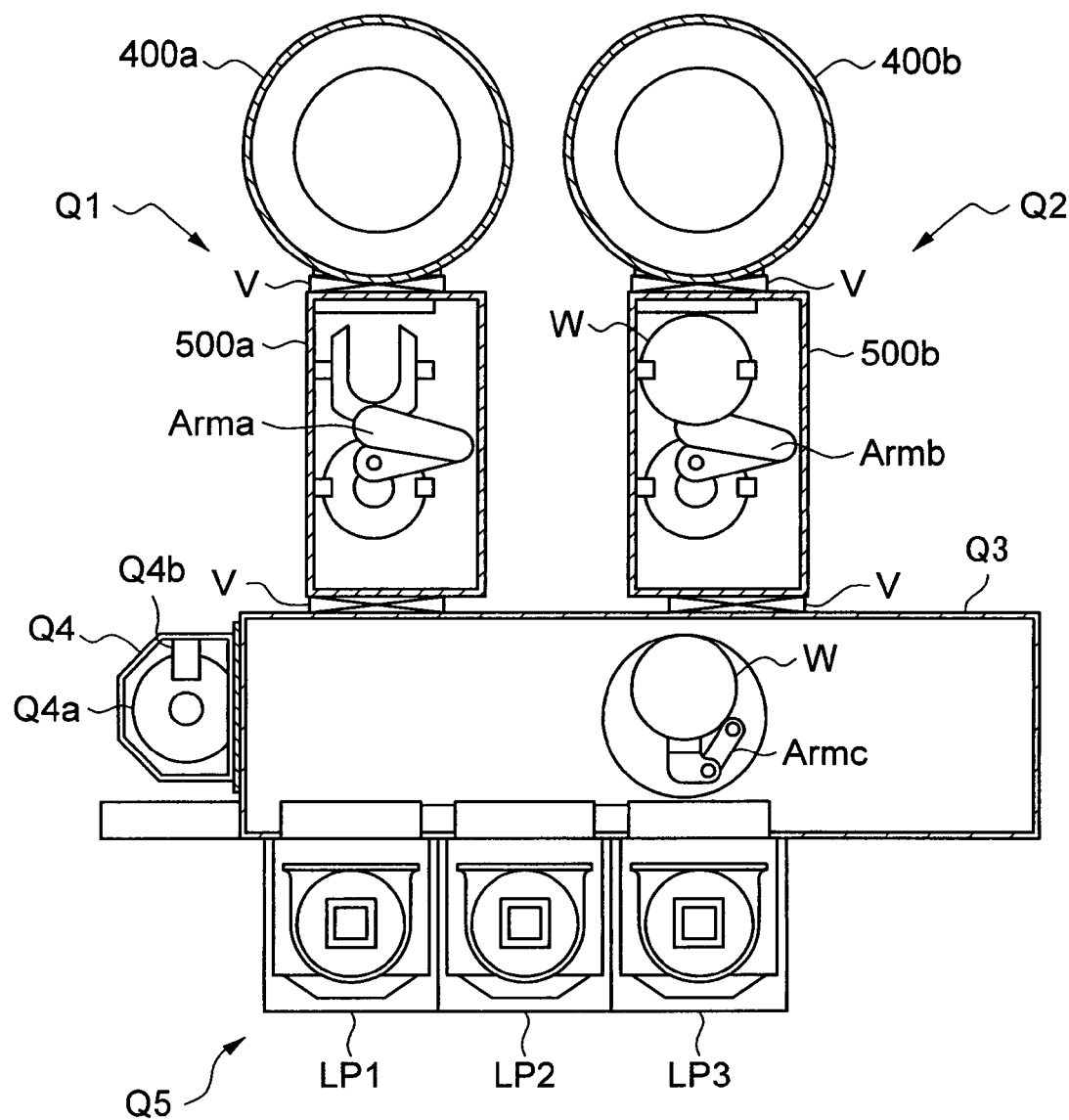
FIG. 3 is a configuration diagram of a substrate processing apparatus according to the first to third embodiments of the present invention.
Figure 15:
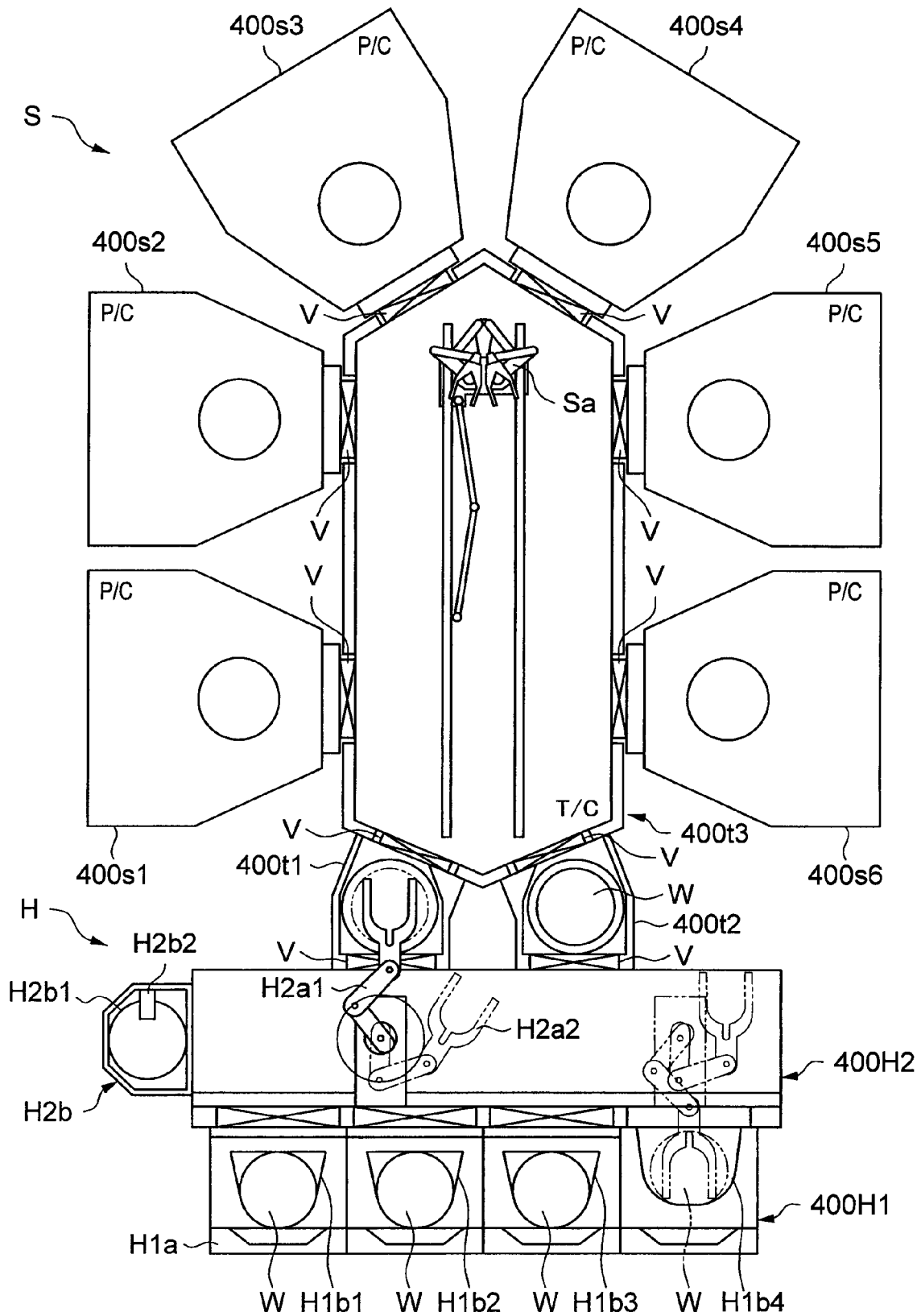
FIG. 15 is a schematic vertical cross-sectional view of another internal structure of the PM.

For example, the substrate processing apparatus may not be limited to the structure that is shown in FIG. 3 and may also have the structure that is shown in FIG. 15. The substrate processing apparatus of FIG. 15 includes the transfer system H that transfers the wafer W, and the processing system S performs the substrate processing on the wafer W, such as a deposition process, the etching process, or the like. The transfer system H and the processing system S are linked through load lock modules (LLMs) 400t1, 400t2.

The transfer system H includes a cassette stage 400H1 and a transfer stage 400H2. A container carrier platform H1a is provided in the cassette stage 400H1, and four cassette containers H1b1 to H1b4 are placed on the container carrier platform H1a. Each of the cassette containers H1b can accommodate, on a plurality of levels, unprocessed product substrates (wafers W), processed product substrates, and non-product substrates that are used for dummy processes.

Two bendable, extendable, and rotatable transfer arms H2a1, H2a2 are supported such that they move in a sliding motion under magnetic drive on the transfer stage 400H2. The wafers W are held by forks that are mounted on the ends of the arms H2a1, H2a2.

At one end of the transfer stage 400H2, an alignment mechanism H2b is provided that performs aligning of the wafer W. The alignment mechanism H2b aligns the wafer W by rotating a rotating platform H2b1 on which the wafer W is placed and using an optical sensor H2b2 to detect the state of the outer edge of the wafer W.

A stage on which the wafer W is placed is provided inside each of the load lock modules 400t1, 400t2. Gate valves V are provided at both ends of the load lock modules 400t1, 400t2 and can open and close in an airtight manner. According to this configuration, the transfer system H transfers the wafer W among the cassette containers H1b1 to H1b4, the load lock modules 400t1, 400t2, and the alignment mechanism H2b.

The processing system S is provided with a transfer chamber (T/C) 400t3 and six process chambers (P/Cs) 400s1 to 400s6 (equivalent to the PM1 to the PM6). The transfer chamber 400t3 is connected to the process chambers 400s1 to 400s6 through gate valves s1a to s1f, respectively, which can open and close in an airtight manner. A bendable, extendable, and rotatable arm Sa is provided in the transfer chamber 400t3.

According to this configuration, the processing system S uses the arm Sa to transfer the wafer W from the load lock modules 400t1, 400t2, through the transfer chamber 400t3, and to the process chambers 400s1 to 400s6. The processing system S performs a process such as the etching process or the like on the wafer W, then unloads the wafer W through the transfer chamber 400t3 to the load lock modules 400t1, 400t2.

The substrate processing apparatus in FIG. 15 also selects, among the six transfer chambers P/C (that correspond to the PM 400), the P/C that is least frequently used at that point. In response to the lot units or the wafer units selected depending on the degree of microfabrication for the lot, all wafers in the lot are sequentially transferred to the selected P/C (for the lot units), or sequentially OR transferred one by one from the selected P/C to different P/Cs (for the wafer units).

The wafers W in a lot to be microfabricated are thus all processed in the same processing chamber, thereby reducing the variation in the process and forming almost the uniform products. The wafers W in a lot not to be microfabricated are transferred to different processing chambers where the wafers are processed in parallel, thereby increasing the process throughput.

Note that the substrate processing apparatus according to the present invention is shown as including two processing chambers in FIG. 3 and six processing chambers in FIG. 15, but the present invention is not limited thereto, and the substrate processing apparatus may include any number of processing chambers. The processing chamber according to the present invention is not limited to the deposition process. The processing chamber may perform any substrate processes such as the thermal diffusion process and the etching process.

Examples of the systems for performing these processes include an etching system, a chemical vapor deposition (CVD) system, an ashing system, a sputtering system, a coater/developer, a cleaning system, a chemical mechanical polishing (CMP) system, a physical vapor deposition (PVD) system, an exposure system, and an ion implanter. These systems may be embodied by various substrate processing apparatuses such as a microwave plasma substrate processing apparatus, an inductive-coupling plasma substrate processing apparatus, and a capacitive-coupling plasma substrate processing apparatus.

The present invention may be applied to various substrates such as a glass substrate and a silicon wafer. The present invention may be applied to substrates for use in various displays such as the organic EL display, the plasma display, and the liquid crystal display (LCD).

The control device of the present invention may also be embodied by the EC 200 alone and may also be embodied by the EC 200 and the MC 300.

What is claimed is:

1. A control device for controlling a substrate processing apparatus, the apparatus including a plurality of processing chambers that perform a specified process on a substrate and a transfer mechanism that transfers the substrate, the control device comprising:

a selection unit that selects a processing chamber to which a next substrate is to be transferred, and selects, for each substrate lot, whether the substrates are transferred to the same processing chamber in one-lot units or in one-substrate units depending on a degree of microfabrication requested for each lot;

a transfer control unit that sequentially transfers the substrates in the units selected by the selection unit to the processing chamber selected by the selection unit; and a storage unit that stores an order of the processing chambers as are used to process the substrate, wherein the selection unit selects, according to the order of the processing chambers stored in the storage unit, the processing chamber that has spent most amount of time since a last process among a processing chamber group specified in a recipe, and the transfer control unit sequentially transfers the substrates in the selected units to the selected processing chamber.

2. The control device according to claim 1, wherein:
when the selection unit selects the one-lot units, the transfer control unit sequentially transfers all substrates included in a lot to the selected processing chamber, and
when the selection unit selects the one-substrate units, the transfer control unit transfers a first substrate included in a lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and the transfer control unit repeatedly transfers a next substrate included in the lot to a next processing chamber until a last substrate included in the lot.

3. The control device according to claim 1, wherein
when the selection unit selects the one-lot units, the transfer control unit transfers a test substrate only to the selected processing chamber before transferring a product substrate.

4. The control device according to claim 1, wherein
when the selection unit selects the one-substrate units, the transfer control unit transfers a test substrate only to each processing chamber of a processing chamber group specified in a recipe before transferring a product substrate.

5. A method implemented on a control device for controlling a substrate processing apparatus, the apparatus including a plurality of processing chambers that perform a specified process on a substrate and a transfer mechanism that transfers the substrate, the method comprising:
selecting a processing chamber to which a next substrate is to be transferred, and selecting whether the substrates are transferred to the same processing chamber in one-lot units or in one-substrate units depending on a degree of microfabrication requested for each substrate lot;
sequentially transferring the substrates in the selected units to the selected processing chamber; and
storing an order of the processing chambers as are used to process the substrate,
wherein the selecting includes selecting, according to the order of the processing chambers stored, the processing chamber that has spent a most amount of time since a last process among a processing chamber group specified in a recipe, and
the sequentially transferring includes sequentially transferring the substrates in the selected units to the selected processing chamber.

6. The method according to claim 5, wherein:
when selecting the one-lot units, sequentially transferring all substrates included in a lot to the selected processing chamber, and
when selecting the one-substrate units, transferring a first substrate included in a lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and repeatedly transferring a next substrate included in the lot to a next processing chamber until a last substrate included in the lot.

7. The method according to claim 5, wherein
when selecting the one-lot units, transferring a test substrate only to the selected processing chamber before transferring a product substrate.

8. The method according to claim 5, wherein
when selecting the one-substrate units, the transferring a test substrate only to each processing chamber of a processing chamber group specified in a recipe before transferring a product substrate.

9. A computer readable storage medium storing a control program that instructs a computer to control a substrate processing apparatus including a plurality of processing chambers that perform a specified process on a substrate and a transfer mechanism that transfers the substrate, the control program comprising instructions that command the computer to execute the steps of:
selecting a processing chamber to which a next substrate is to be transferred, and selecting whether the substrates are transferred to the same processing chamber in one-lot units or in one-substrate units depending on a degree of microfabrication requested for each substrate lot;
sequentially transferring the substrates in the selected units to the selected processing chamber; and
storing an order of the processing chambers as are used to process the substrate,
wherein the selecting includes selecting, according to the order of the processing chambers stored, the processing chamber that has spent a most amount of time since a last process among a processing chamber group specified in a recipe, and
the sequentially transferring includes sequentially transferring the substrates in the selected units to the selected processing chamber.

10. The computer readable storage medium according to claim 9, wherein:
when selecting the one-lot units, sequentially transferring all substrates included in a lot to the selected processing chamber, and
when selecting the one-substrate units, transferring a first substrate included in a lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and repeatedly transferring a next substrate included in the lot to a next processing chamber until a last substrate included in the lot.

11. The computer readable storage medium according to claim 9, wherein
when selecting the one-lot units, transferring a test substrate only to the selected processing chamber before transferring a product substrate.

12. The computer readable storage medium according to claim 9, wherein
when selecting the one-substrate units, the transferring a test substrate only to each processing chamber of a processing chamber group specified in a recipe before transferring a product substrate.

13. A control device for controlling a substrate processing apparatus, the apparatus including a plurality of processing chambers that perform a specified process on a substrate and a transfer mechanism that transfers the substrate, the control device comprising:
- a selection unit that selects a processing chamber to which a next substrate is to be transferred, and selects, for each substrate lot, whether the substrates are transferred to the same processing chamber in one-lot units or in one-substrate units depending on a degree of microfabrication requested for each lot;
- a transfer control unit that sequentially transfers the substrates in the units selected by the selection unit to the processing chamber selected by the selection unit; and
- a storage unit that stores, for each processing chamber, total number of substrates processed in the each processing chamber before the each processing chamber is cleaned,
- wherein the selection unit selects, according to the total number of substrates processed that is stored in the storage unit, the processing chamber that has processed minimum number of substrates among a processing chamber group specified in a recipe, and
- the transfer control unit sequentially transfers the substrates in the selected units to the selected processing chamber.

14. The control device according to claim 13, wherein:
when the selection unit selects the one-lot units, the transfer control unit sequentially transfers all substrates included in a lot to the selected processing chamber, and
when the selection unit selects the one-substrate units, the transfer control unit transfers a first substrate included in a lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and the transfer control unit repeatedly transfers a next substrate included in the lot to a next processing chamber until a last substrate included in the lot.

15. The control device according to claim 13, wherein when the selection unit selects the one-lot units, the transfer control unit transfers a test substrate only to the selected processing chamber before transferring a product substrate.

16. The control device according to claim 13, wherein when the selection unit selects the one-substrate units, the transfer control unit transfers a test substrate only to each processing chamber of a processing chamber group specified in a recipe before transferring a product substrate.

17. A control device for controlling a substrate processing apparatus, the apparatus including a plurality of processing chambers that perform a specified process on a substrate and a transfer mechanism that transfers the substrate, the control device comprising:
- a selection unit that selects a processing chamber to which a next substrate is to be transferred, and selects, for each substrate lot, whether the substrates are transferred to the same processing chamber in one-lot units or in one-substrate units depending on a degree of microfabrication requested for each lot;
- a transfer control unit that sequentially transfers the substrates in the units selected by the selection unit to the processing chamber selected by the selection unit; and
- a storage unit that stores, for each processing chamber, total amount of time spent in processing the substrates in the each processing chamber before the each processing chamber is cleaned,
- wherein the selection unit selects, according to the total amount of time spent in processing the substrates that is stored in the storage unit, the processing chamber that has spent least amount of time in processing the substrates among a processing chamber group specified in a recipe, and
- the transfer control unit sequentially transfers the substrates in the selected units to the selected processing chamber.

18. The control device according to claim 17, wherein:
when the selection unit selects the one-lot units, the transfer control unit sequentially transfers all substrates included in a lot to the selected processing chamber, and
when the selection unit selects the one-substrate units, the transfer control unit transfers a first substrate included in a lot to, among the processing chamber group specified in the recipe, a processing chamber selected from the processing chamber that has spent most amount of time since a last process, the processing chamber that has processed minimum number of substrates, and the processing chamber that has spent least amount of time in processing the substrates, and the transfer control unit repeatedly transfers a next substrate included in the lot to a next processing chamber until a last substrate included in the lot.

19. The control device according to claim 17, wherein when the selection unit selects the one-lot units, the transfer control unit transfers a test substrate only to the selected processing chamber before transferring a product substrate.

20. The control device according to claim 17, wherein when the selection unit selects the one-substrate units, the transfer control unit transfers a test substrate only to each processing chamber of a processing chamber group specified in a recipe before transferring a product substrate.

* * * * *